United States Patent
Zhou et al.

(10) Patent No.: US 12,424,979 B2
(45) Date of Patent: Sep. 23, 2025

(54) METHOD FOR PREDICTING ENVELOPE FEATURES AND GENERATING SWITCHING CONVERTER CONTROL SIGNAL IN ENVELOPE TRACKING POWER SUPPLY, STORAGE MEDIUM, AND ELECTRONIC DEVICE

(71) Applicant: Nanjing University Of Posts And Telecommunications, Jiangsu (CN)

(72) Inventors: Yan Zhou, Jiangsu (CN); Guodong Liu, Jiangsu (CN); Wenxuan Xie, Jiangsu (CN); Yan Fan, Jiangsu (CN); Zhihao Zhang, Jiangsu (CN)

(73) Assignee: Nanjing University Of Posts And Telecommunications, Jiangsu (CN)

( * ) Notice: Subject to any disclaimer, the term of this patent is extended or adjusted under 35 U.S.C. 154(b) by 338 days.

(21) Appl. No.: 18/321,723

(22) Filed: May 22, 2023

(65) Prior Publication Data

US 2023/0291357 A1    Sep. 14, 2023

Related U.S. Application Data

(63) Continuation of application No. PCT/CN2022/127327, filed on Oct. 25, 2022.

(30) Foreign Application Priority Data

Feb. 24, 2022  (CN) .......................... 202210172081.8
May 30, 2022  (CN) .......................... 202210598112.6

(51) Int. Cl.
*H03F 1/02* (2006.01)
*G06N 3/09* (2023.01)
*H02M 3/158* (2006.01)

(52) U.S. Cl.
CPC ............. *H03F 1/0238* (2013.01); *G06N 3/09* (2023.01); *H02M 3/1584* (2013.01); *H03F 2200/451* (2013.01)

(58) Field of Classification Search
CPC .. H03F 2200/451; H03F 3/245; H03F 1/0216; H03F 1/0222; H03F 1/302;
(Continued)

(56) References Cited

U.S. PATENT DOCUMENTS

| | | | |
|---|---|---|---|
| 2017/0229871 A1* | 8/2017 | Liu | H02M 7/49 |
| 2018/0109201 A1* | 4/2018 | Li | F03D 17/00 |
| 2020/0403412 A1* | 12/2020 | Kang | H02J 3/381 |

FOREIGN PATENT DOCUMENTS

| | | |
|---|---|---|
| CN | 103326549 | 9/2013 |
| CN | 108322047 | 7/2018 |

(Continued)

OTHER PUBLICATIONS

"International Search Report (Form PCT/ISA/210) of PCT/CN2022/127327," mailed on Jan. 13, 2023, pp. 1-4.
(Continued)

*Primary Examiner* — Ajibola A Akinyemi
(74) *Attorney, Agent, or Firm* — JCIPRNET

(57) ABSTRACT

Embodiments of the present application provide a method for predicting envelope features. The method includes: according to baseband data or data after modulation mapping, a peak value of a radio frequency envelope signal, a time point corresponding to the peak value, a valley point of the radio frequency envelope signal and a time point corresponding to the valley point are predicted; according to the valley point and the time point corresponding thereto, a generated reference value is sent to a low-bandwidth control signal generating module to obtain a control signal; according to adjacent valley point and peak point, and time points
(Continued)

corresponding thereto, generated status information is sent to a high-bandwidth control signal generating module to obtain a control switch signal; and when in an ascending status, according to a key information string, a slope k of a connecting line is determined, and a corresponding filter inductor is turned on.

24 Claims, 12 Drawing Sheets

(58) Field of Classification Search
CPC .................. H03F 1/32; H03F 2200/102; H03F 2200/105; H03F 2200/111; H03F 2200/18; H03F 2200/21; H03F 2200/555; H03F 3/19; H03F 3/21
USPC ...................................................... 455/127.1
See application file for complete search history.

(56) References Cited

FOREIGN PATENT DOCUMENTS

| CN | 113556025 | 10/2021 |
|----|-----------|---------|
| CN | 113572340 | 10/2021 |
| CN | 114865894 | 8/2022 |

OTHER PUBLICATIONS

"Written Opinion of the International Searching Authority (Form PCT/ISA/237) of PCT/CN2022/127327," mailed on Jan. 13, 2023, pp. 1-5.

Leng, Yang, "High Efficiency Envelope Tracking Power Supply Adopting Power Spectrum Allocation Method," Master's thesis, Mar. 2018, Department of Electrical Engineering, Nanjing University of Aeronautics and Astronautics.

* cited by examiner

METHOD FOR PREDICTING ENVELOPE FEATURES AND GENERATING SWITCHING CONVERTER CONTROL SIGNAL IN ENVELOPE TRACKING POWER SUPPLY, STORAGE MEDIUM, AND ELECTRONIC DEVICE

CROSS-REFERENCE TO RELATED APPLICATION

This application is a continuation of international application of PCT application serial no. PCT/CN2022/127327 filed on Oct. 25, 2022, which claims the priority benefit of China application no. 202210598112.6 filed on May 30, 2022 and China application no. 202210172081.8 filed on Feb. 24, 2022. The entirety of each of the above mentioned patent applications is hereby incorporated by reference herein and made a part of this specification.

BACKGROUND

Technical Field

The present application relates to the technical field of wireless communication and power electronics, and in particular, to a method for predicting envelope features and generating a switching converter control signal in an envelope tracking power supply, a storage medium, and an electronic device.

Description of Related Art

Envelope tracking (ET) technology is one of the most widely used and most effective methods for improving the power supply efficiency of a radio frequency power amplifier. The technology greatly reduces energy loss and improves power supply efficiency while ensuring undistorted transmission of a radio frequency (RF) signal.

In the architecture of the envelope tracking technology, a combination of a linear amplifier and switching converters with various bandwidths is mostly used. A low-bandwidth switching converter supplements low-frequency component energy, a high-bandwidth switching converter combination provides high-frequency component energy, and a linear amplifier supplements the tracking difference to ensure the linearity of the output waveform.

A control signal required by the switching converter in an envelope tracking power supply system is usually generated by filtering a radio frequency envelope signal, which has the disadvantages of complicated operation in the generation process, high occupancy of hardware calculation resources and long calculation time. A traditional solution requires the introduction of an additional time delay in an input signal link to match the power supply waveform of the envelope tracking power supply. In addition, there are large differences in data format and time series between a baseband signal and a reference signal in the envelope tracking power supply, and there is no clear correspondence.

According to the present application, key features of the envelope are directly predicted based on baseband data or data after modulation mapping, and relevant control signals are directly generated and provided to low-bandwidth and high-bandwidth switching converters. The proposed ET technology has the characteristics of simple control strategy, low time delay, high power supply efficiency and the like.

The existing patent application CN113556025A discloses a method and system for generating a reference signal of a switching converter in an envelope tracking power supply. A RF envelope signal is processed by a filter, constant reference values are taken in different defined time intervals, and a reference signal in a corresponding switching converter is generated. The taken time interval and the constant reference value corresponding thereto are determined by the properties of the RF envelope signal and the switching converter. Compared with other existing technologies, this patent application has a certain effect in improving the power supply efficiency of a radio frequency power amplifier in the envelope tracking power supply and reducing the required hardware calculation resources.

SUMMARY

Exemplary embodiments of the present application aim to provide a method for predicting envelope features and generating a switching converter control signal in an envelope tracking power supply, a storage medium, and an electronic device, so as to solve at least the problems in the prior art that according to the method where a RF envelope signal is processed by a filter, constant reference values are taken in different defined time intervals and a reference signal in a corresponding switching converter is generated, in practical use, the algorithm is cumbersome, a filter and a subtractor need to be introduced, digital filtering calculation and weighted average calculation of all envelope signals are performed through FPGA, the calculation workload of hardware is large, more hardware calculation resources are consumed, and the cost is high.

In one embodiment of the present application, a method for predicting envelope features and generating a switching converter control signal in an envelope tracking power supply is provided and includes: according to baseband data or data after modulation mapping, predicting, by a neural network, and outputting a peak value of a radio frequency envelope signal, a time point corresponding to the peak value, a valley point of the radio frequency envelope signal and a time point corresponding to the valley point; according to the valley point of the envelope and the time point corresponding to the valley point, sending, by a reference value generating module, a generated reference value to a low-bandwidth control signal generating module to obtain a low-bandwidth switching converter control signal; according to adjacent valley point and peak point of the envelope, and time points corresponding to the adjacent valley point and peak point, sending, by a status determiner, generated status information to a high-bandwidth control signal generating module to obtain a high-bandwidth switching converter control switch signal; and when the envelope signal is in an ascending status, according to a key information string including the peak value, the valley value, and the time points respectively corresponding to the peak value and the valley value, determining a slope k of a connecting line between the valley point and the peak point, sending, by a slope calculator, the calculated slope k to a filter inductor control signal module, and selecting to turn on a corresponding filter inductor in a high-bandwidth switching converter.

Optionally, according to the valley point of the envelope and the time point corresponding to the valley point, an average of a plurality of valley points within a defined time period or a multiple related to the average or a peak value of the valley points within a preset time is found to serve as a control reference value of the low-bandwidth switching converter; and a duration of the preset time is not less than a response time for establishing an output voltage of the low-bandwidth switching converter, and start and end points of the preset time are composed of the peak value or the valley point.

Optionally, the method for generating the reference value according to the valley point includes the following three types: (1) two different peak points of the envelope serve as start and end points of the reference value, and a valley weighted average between the two peak values or a multiple of the average serves as an amplitude of the reference value to obtain a constant reference value; or (2) two different valley points of the envelope serve as start and end points of the reference value, and a valley weighted average between the two valley points or a multiple of the average serves as an amplitude of the reference value to obtain a constant reference value; or (3) a valley point and a peak point of the envelope serve as start and end points of the reference value, and a valley weighted average between the valley point and the peak point or a multiple of the average as an amplitude of the reference value to obtain a constant reference value.

Optionally, the status determiner determines whether a current status of the envelope signal is an ascending status from a valley value to a peak value or a descending status from a peak value to a valley value, and a control signal of the high-bandwidth switching converter is provided according to distribution features of the adjacent valley point and peak point, that is, a high-level signal to turn on a switching transistor is provided at a time of or near the valley value, and a low-level signal to turn off the switching transistor is provided at a time of arriving at or near the peak value.

Optionally, when the envelope signal is in the ascending status, according to the key information string including the peak value and the valley value of the envelope, and the time points corresponding to the peak point and the valley point, the slope k of the connecting line between the valley point and the peak point is determined, $$k = \frac{V_{peak} - V_{valley}}{t_{peak} - t_{valley}}$$

where in the formula, $V_{peak}$ is an amplitude of the peak value, $V_{valley}$ is an amplitude of the valley value, $t_{peak}$ is a relative time value of the peak value, and $t_{valley}$ is a relative time value of the valley value.

Optionally, according to a different slope k, the high-bandwidth switching converter selects a filter inductor with a different inductance value; when the value of the slope k is greater than a preset threshold M, the filter inductor with a smaller inductance value is selected to provide a higher current change rate; and when the value of k is less than the preset value M, the filter inductor with a larger inductance value is selected to provide a lower current change rate.

Optionally, when the envelope signal is in the descending status, if a time length between the peak point and the adjacent valley point is greater than a preset threshold T, a high-level signal with a duration $t_2$ is given to the high-bandwidth switching converter again after a short time $t_1$, such that the high-bandwidth switching converter is turned on again to provide a current and supplement a difference with the envelope signal, where $t_1+t_2<T$.

Optionally, the method further includes: for a baseband signal or data after modulation mapping, applying a trained radio frequency signal envelope prediction model that takes the baseband signal or the data after modulation mapping as an input and the envelope key information string corresponding to the baseband signal or the data after modulation mapping as an output to obtain the envelope key information string corresponding to the baseband signal or the data after modulation mapping, where the envelope key information string includes a peak point and a valley point of the envelope signal corresponding to the baseband signal or the data after modulation mapping, and time points respectively corresponding to the peak point and the valley point.

Optionally, the radio frequency signal envelope prediction model, based on preset baseband signals, is obtained by the following training method: according to a preset envelope key information string extraction method, obtaining envelope key information strings respectively corresponding to the baseband signals; and training a multi-carrier fitting unit by taking the baseband signal as an input and the envelope key information string corresponding to the baseband signal as an output to obtain the radio frequency signal envelope prediction model.

Optionally, the envelope key information string is obtained from the envelope signal by writing a program.

Optionally, the multi-carrier fitting unit is of a neural network structure.

Optionally, the preset envelope key information string extraction method includes the following steps: Step A: subjecting each baseband signal as an input to modulation to obtain serial data corresponding to each baseband signal, and then entering Step B, where the baseband sample signal is a series of random 0-bit and 1-bit signals; Step B: subjecting the serial data as an input to multi-carrier modulation to obtain a radio frequency envelope signal, and then entering Step C; and Step C: passing the radio frequency envelope signal as an input through an envelope key information string extraction module to obtain the envelope key information string.

Optionally, the training a multi-carrier fitting unit by taking a 0-bit or 1-bit baseband signal as an input and the envelope key information string corresponding to the baseband signal as an output to obtain the radio frequency signal envelope prediction model includes: Step S11: loading the baseband signal to the multi-carrier fitting unit to serve as an input signal, and then entering Step S12; Step S12: subjecting the baseband signal as an input to data grouping and serial-parallel processing to obtain serial-parallel symbols, and then entering Step S13; and Step S13: subjecting the serial-parallel symbols as an input to multi-carrier data fitting to obtain the envelope key information string.

Optionally, the training method further includes: the envelope key information string includes a peak point and a valley point of an envelope, and time points respectively corresponding to the peak point and the valley point.

Optionally, in Step S12, the data grouping and serial-parallel processing includes: equally dividing bits into symbols according to a preset communication modulation algorithm, and performing serial-parallel processing on the symbols according to the number of carriers to obtain serial-parallel symbols.

Optionally, the radio frequency signal envelope prediction model, based on preset data signals after modulation mapping, is obtained by the following training method: according to a preset envelope key information string extraction method, obtaining envelope key information strings respectively corresponding to the data sample signals after modulation mapping; and training a multi-carrier fitting unit by taking the data sample signal after modulation mapping as an input and the envelope key information string corresponding to the data sample signal after modulation mapping as an output to obtain the radio frequency signal envelope prediction model.

Optionally, the multi-carrier fitting unit is of a neural network structure.

Optionally, the preset envelope key information string extraction method includes the following steps: Step A1: subjecting each baseband signal as an input to modulation mapping to obtain corresponding serial data after modulation mapping, and then entering Step B1, where the baseband sample signal is a series of random 0-bit and 1-bit signals; Step B1: subjecting the serial data as an input to multi-carrier modulation to obtain a radio frequency envelope signal, and then entering Step C1; and Step C1: passing the radio frequency envelope signal as an input through an envelope key information string extraction module to obtain the envelope key information string.

Optionally, the training a multi-carrier fitting unit by taking data after modulation mapping as an input and the envelope key information string corresponding to the data as an output to obtain the radio frequency signal envelope prediction model includes: Step S21: loading data after modulation mapping to the multi-carrier fitting unit to serve as an input signal, and then entering Step S22; Step S22: subjecting the data after modulation mapping as an input to data processing links of data grouping, real-part and imaginary-part splitting and serial-parallel processing to obtain serial-parallel symbols, and then entering Step S23; and Step S23: subjecting the serial-parallel symbols as an input to multi-carrier data fitting to obtain the envelope key information string.

Optionally, the training method further includes: the envelope key information string includes a peak point and a valley point of an envelope, and time points respectively corresponding to the peak point and the valley point.

Optionally, in Step S22, the data grouping, real-part and imaginary-part splitting and serial-parallel processing includes: performing splitting of real and imaginary parts on data after modulation mapping according to a preset multi-carrier modulation algorithm, performing arrangement in a carrier order, and performing serial-parallel processing jointly to obtain the serial-parallel symbols.

Optionally, the process of constructing the radio frequency signal envelope prediction model further includes: performing the training method periodically to continuously update and optimize the radio frequency signal envelope prediction model.

In one embodiment of the present application, a computer-readable storage medium is further provided. The storage medium stores a computer program, where the computer program is configured to, when running, perform the steps of any one of the above method embodiments.

In one embodiment of the present application, an electronic device is further provided and includes a memory and a processor, where the memory stores a computer program, and the processor is configured to run the computer program to perform the steps of any one of the above method embodiments.

In an optional embodiment of the present application, a method for predicting a radio frequency signal envelope based on baseband data perception is provided. The method can directly generate information required by an envelope tracking power supply from a baseband signal through a radio frequency envelope prediction model, so that the speed of the envelope tracking power supply generating a reference voltage waveform required by a radio frequency power amplifier is effectively increased, and the time delay of a radio frequency envelope signal and the calculation requirement on hardware are reduced.

Compared with the prior art in which FPGA hardware is used for filter calculation and the average calculation of all envelope signals resulting in the problems that more hardware logic resources are used and the calculation amount is large, the present application provides a new method for predicting envelope features and generating a switching converter control signal in an envelope tracking power supply based on key information of a peak value and a valley value of an envelope, and time points corresponding to the peak value and the valley value. The working principle of the method is simple, the reference value is generated without filter calculation, only the valley values are subjected to weighted calculation, the calculation times are fewer, the selection of a filter inductor is added in a hardware circuit, and the calculation amount is significantly reduced compared with the solution in the prior art. The output power of a linear amplifier can be effectively reduced, the workload of the hardware is greatly reduced, and the efficiency of the envelope tracking power supply system of a radio frequency power amplifier is improved. According to the present application, key features of the envelope are directly predicted through baseband data or data after modulation mapping, and related control signals are directly generated and provided to low-bandwidth and high-bandwidth switching converters. The proposed ET technology has the characteristics of low time delay and high-power supply efficiency.

To make the aforementioned more comprehensible, several embodiments accompanied with drawings are described in detail as follows.

BRIEF DESCRIPTION OF THE DRAWINGS

The accompanying drawings described herein are used to providing a further understanding of the present application, and form a part of the present application. The exemplary embodiments and descriptions thereof of the present application are used to explain the present application and do not constitute an undue limitation on the present application. In the drawings.

DESCRIPTION OF THE EMBODIMENTS

The present application will be described in detail below with reference to the accompanying drawings and embodiments. It should be noted that the embodiments and features in the embodiments in the present application may be combined with each other without conflicts.

It should be noted that the terms "first", "second", and so on in the description and claims of this application and in the above accompanying drawings are intended to distinguish between similar objects but do not necessarily indicate a specific order or sequence.

Figure 1:
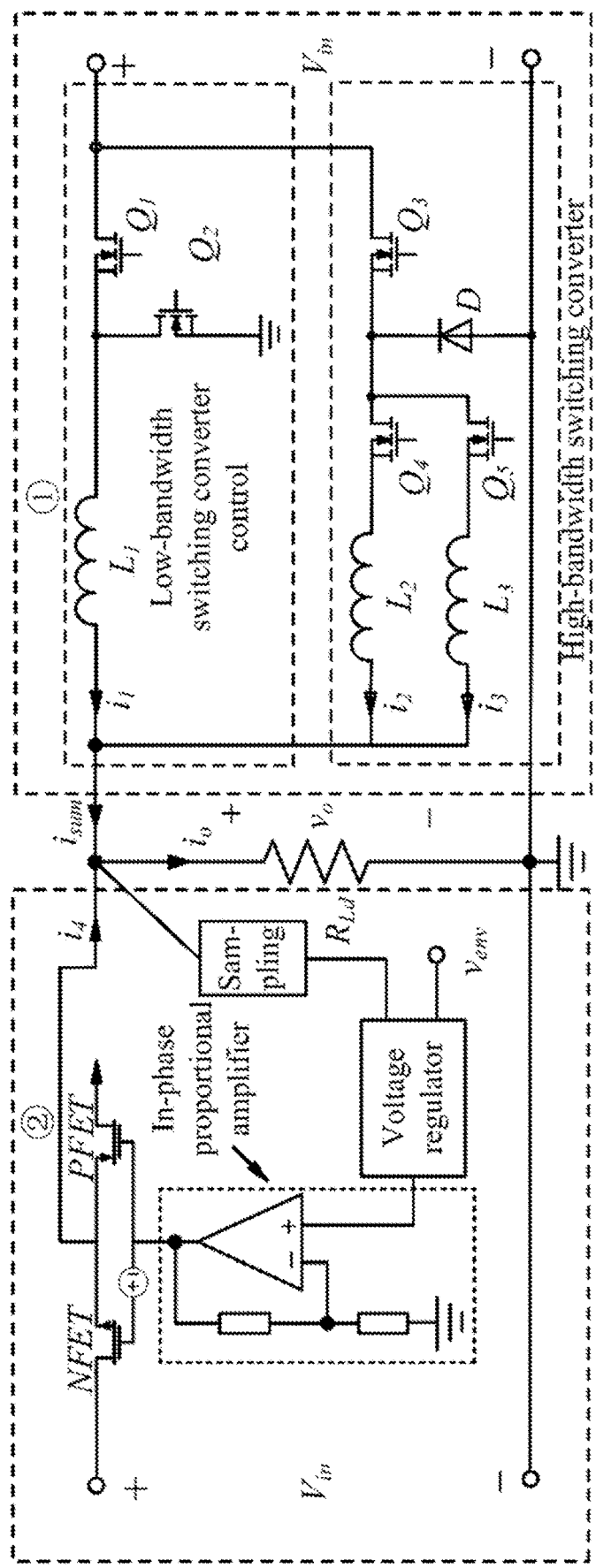
FIG. 1 is a schematic diagram of an optional parallel architecture using a combination of high-bandwidth and low-bandwidth switching converters and a linear amplifier according to an embodiment of the present application.

FIG. 1 is an embodiment of a parallel architecture implemented by combining two switching converters with different bandwidths and a linear amplifier. In the figure, ① represents the part of a low-bandwidth switching converter and a high-bandwidth switching converter implemented with a buck converter, in which $Q_1$ to $Q_5$ are all switching transistors, D is a flyback diode, $L_1$, $L_2$ and $L_3$ are all filter inductors, only one of two filter inductors of the high-bandwidth switching converter is turned on, $i_1$ is a current provided by the low-bandwidth converter, $i_2$ and $i_3$ are currents provided by the high-bandwidth converter, and $i_{sum}$ is the sum of the currents provided by the two converters. In the figure, ② represents the part of a linear amplifier, in which a load voltage is sampled and sent to a voltage regulator for comparison with an envelope signal, the difference is passed to an in-phase proportional amplifier, a linear current $i_4$ is supplemented through output-stage power transistors NFET and PFET, and $i_4$ and $i_{sum}$ are added to obtain a load current $i_o$, which passes through a load resistor $R_{Ld}$, to obtain a load voltage $V_o$, i.e., an output voltage of the envelope tracking power supply system.

Based on the parallel architecture of ET technology, an embodiment of the present application provides a method for predicting envelope features and generating a switching converter control signal in an envelope tracking power supply. The control method includes the following steps: according to information of a valley point of an envelope, and a time point corresponding to the valley point, finding an average of a plurality of valley points within a defined time period or a multiple related to the average or a peak value of the valley points within a period of time to serve as a low-bandwidth switching converter control reference value. The reference value may be used to generate a Pulse Width Modulation (PWM) control signal or a hysteresis control signal and provide low-frequency component energy in an envelope signal power spectrum of a radio frequency amplifier.

According to information of the adjacent valley point and peak point of the envelope, and the time points thereof, a signal of turning on the high-bandwidth switching converter is provided at the time of the valley point, and a signal of turning off the high-bandwidth switching converter is provided at the time of the peak point.

According to a different slope k, the high-bandwidth switching converter selects a filter inductor with a different inductance value. When the value of the slope k is greater than a preset threshold M, the filter inductor with a smaller inductance value is selected to provide a higher current change rate; and when the value of k is less than the preset value M, the filter inductor with a larger inductance value is selected to provide a lower current change rate.

When the envelope signal is in the descending status, if a time length between the peak point and the adjacent valley point is greater than a preset threshold T, a high-level signal with a duration $t_2$ is given to the high-bandwidth switching converter again after a short time $t_1$, such that the high-bandwidth switching converter is turned on again to provide a current and supplement a difference with the envelope signal. The relationship between $t_1$, $t_2$ and T is $t_1+t_2<T$.

The above switching converter control method is described in detail below with reference to specific examples.

Figure 2:
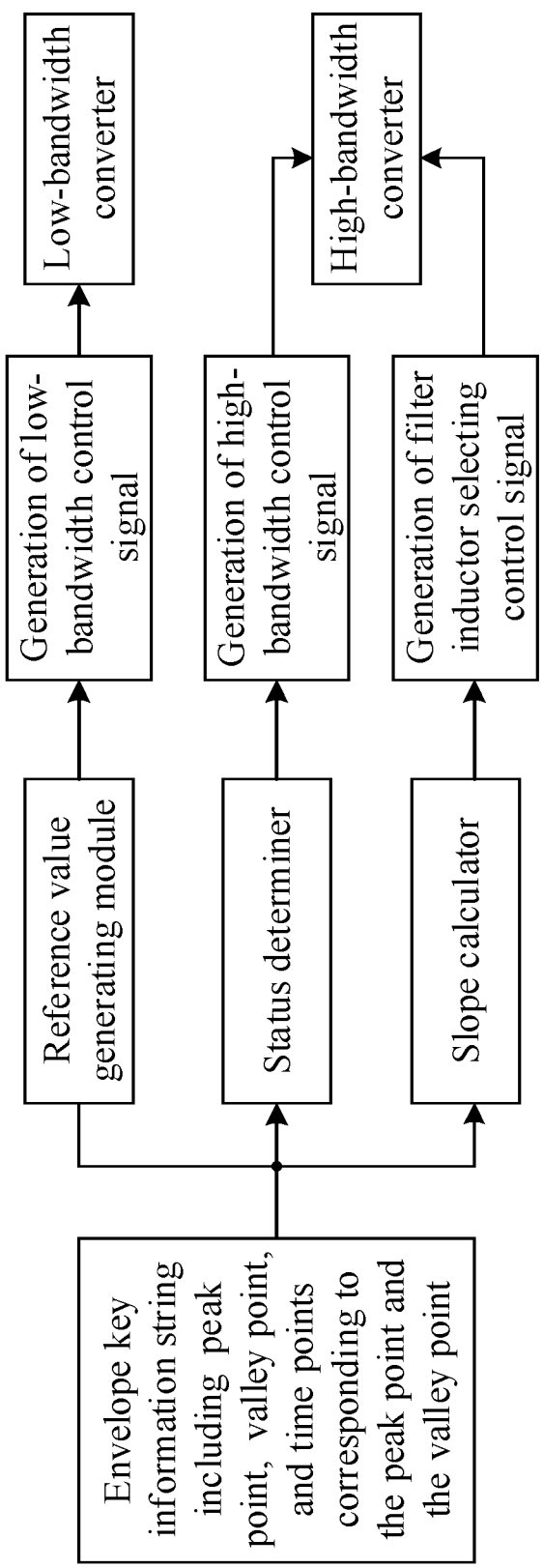
FIG. 2 is a schematic flowchart of an optional method for generating a switching converter control signal according to an embodiment of the present application.

FIG. 2 is a schematic flowchart of generating control signals of low-bandwidth and high-bandwidth switching converters. An information string including a peak point and a valley point of the envelope, and time points corresponding to the peak point and the valley point are sent to a reference value generating module, a status determiner and a slope calculator respectively. The reference value generating module sends the generated reference value to a PMW control signal generating module, and the generated control signal is provided to a low-bandwidth switching converter. The status determiner sends the generated status information to a high-bandwidth control signal generating module to obtain a control signal of a high-bandwidth switching converter, and then the control signal is sent to the high-bandwidth switching converter for control. The slope calculator sends the calculated slope k to a filter inductance control signal generating module for controlled selection of a filter inductor in the high-bandwidth switching converter.

Figure 3:
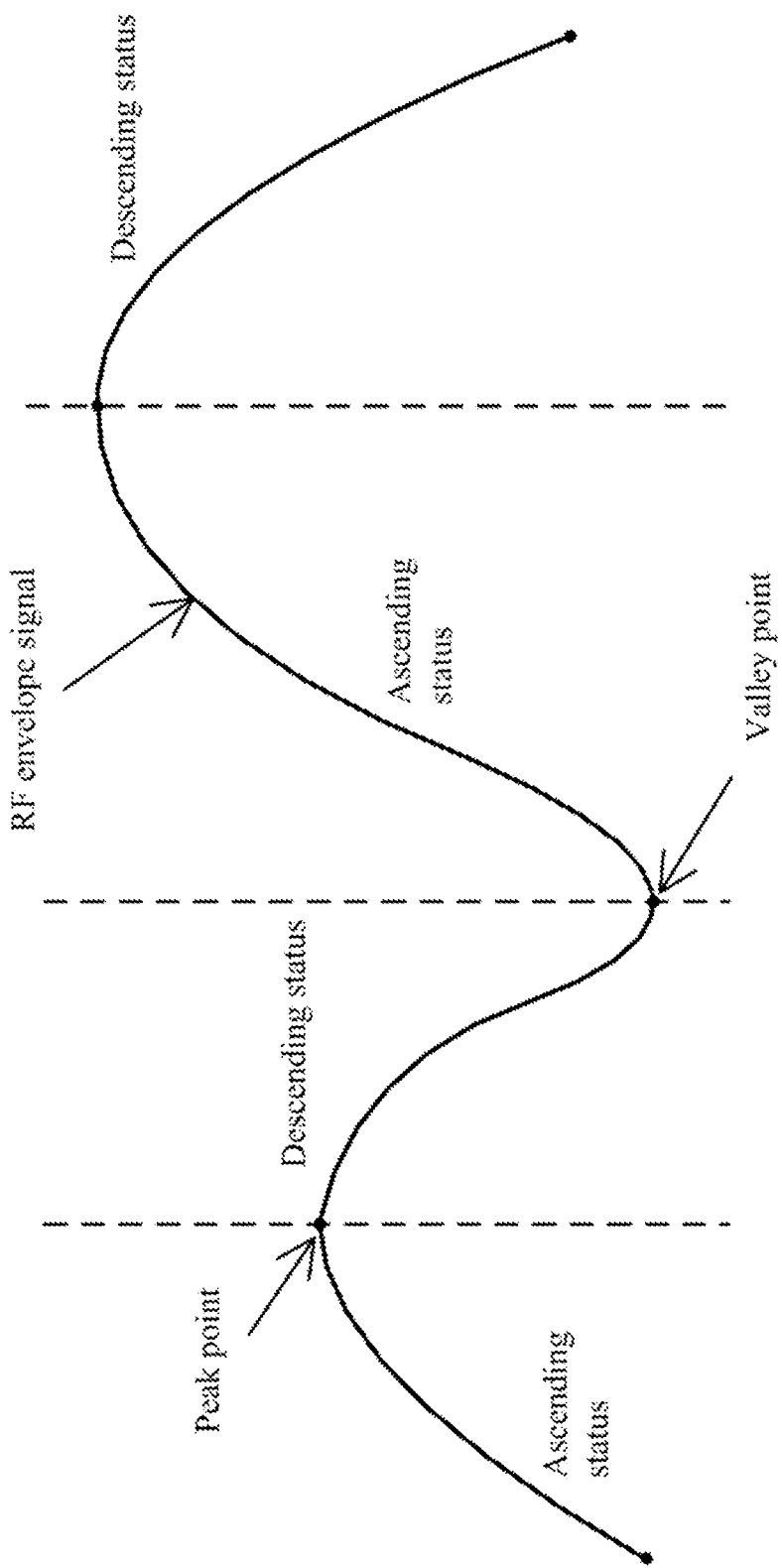
FIG. 3 is a schematic diagram of an ascending status and a descending status of an optional envelope signal according to an embodiment of the present application.

FIG. 3 is a schematic diagram of an envelope signal status obtained based on information of a peak point and a valley point of an envelope, and time points corresponding to the peak point and the valley point. When the envelope changes from a valley value to a peak value, the envelope signal is in a monotonic ascending status. When the envelope changes from a peak value to a valley value, the envelope signal is in a monotonic descending status.

Figure 4:
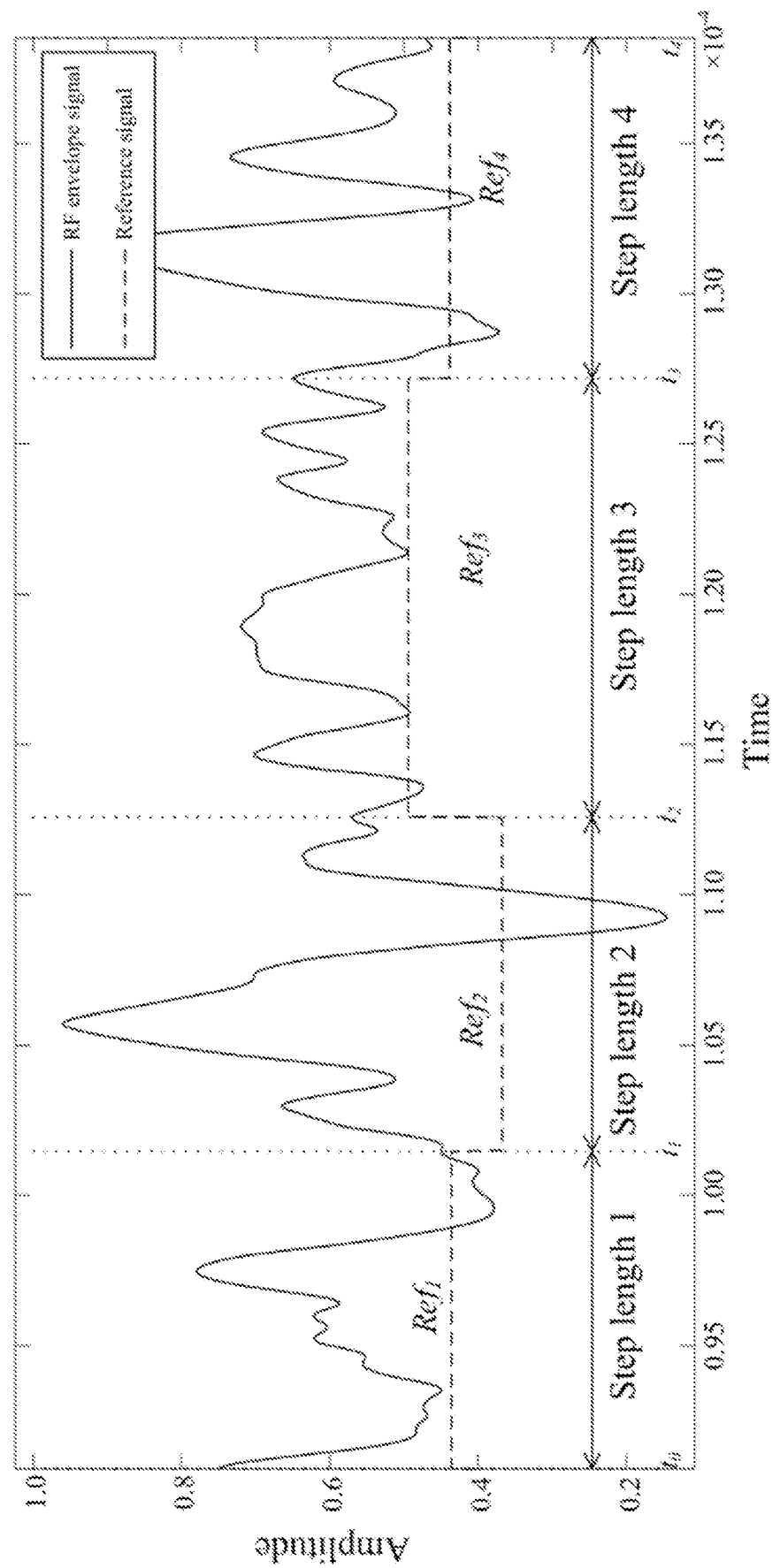
FIG. 4 is a schematic diagram of an optional first low-bandwidth switching converter reference generated based on information of a valley point, a peak point and time points corresponding to the valley point and the peak point according to an embodiment of the present application.

Example 1: FIG. 4 is a schematic diagram of an embodiment of a reference generating method of a low-bandwidth switching converter based on information distribution features of a peak point and a valley point of an envelope, and time points corresponding to the peak point and the valley point. In this method, with a peak point as start and end points of a reference value, a minimum step length and an amplitude threshold are set, a duration of the minimum step length is not less than a response time for establishing an output voltage of the low-bandwidth switching converter, valley values that are greater than the minimum step length and less than the amplitude threshold are subjected to weighted average calculation, and the obtained value serves as a constant reference value. The reference value will be provided to the low-bandwidth switching converter to obtain a corresponding control signal.

Figure 5:
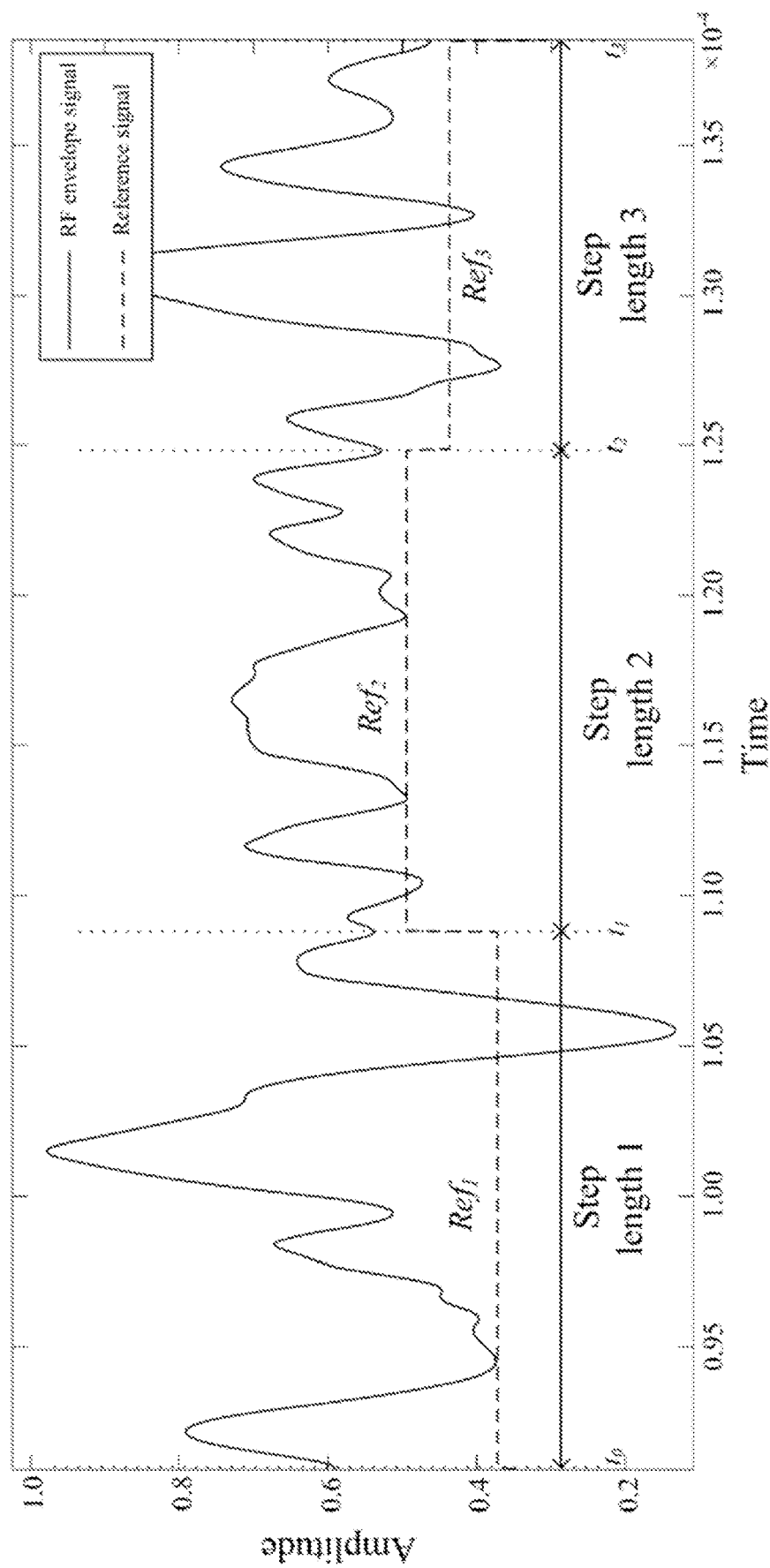
FIG. 5 is a schematic diagram of an optional second low-bandwidth switching converter reference generated based on information of a valley point, a peak point and time points corresponding to the valley point and the peak point according to an embodiment of the present application.

Example 2: FIG. 5 is a schematic diagram of a second reference generating method of a low-bandwidth switching converter based on information distribution features of a peak point and a valley point of an envelope, and time points corresponding to the peak point and the valley point. In this method, with a valley point as start and end points of a reference value, a minimum step length and an amplitude threshold are set, a duration of the minimum step length is not less than a response time for establishing an output voltage of the low-bandwidth switching converter, valley values that are greater than the minimum step length and less than the amplitude threshold are subjected to weighted average calculation, and the obtained value serves as a constant reference value. The reference value will be provided to the high-bandwidth switching converter to obtain a corresponding control signal.

Figure 6:
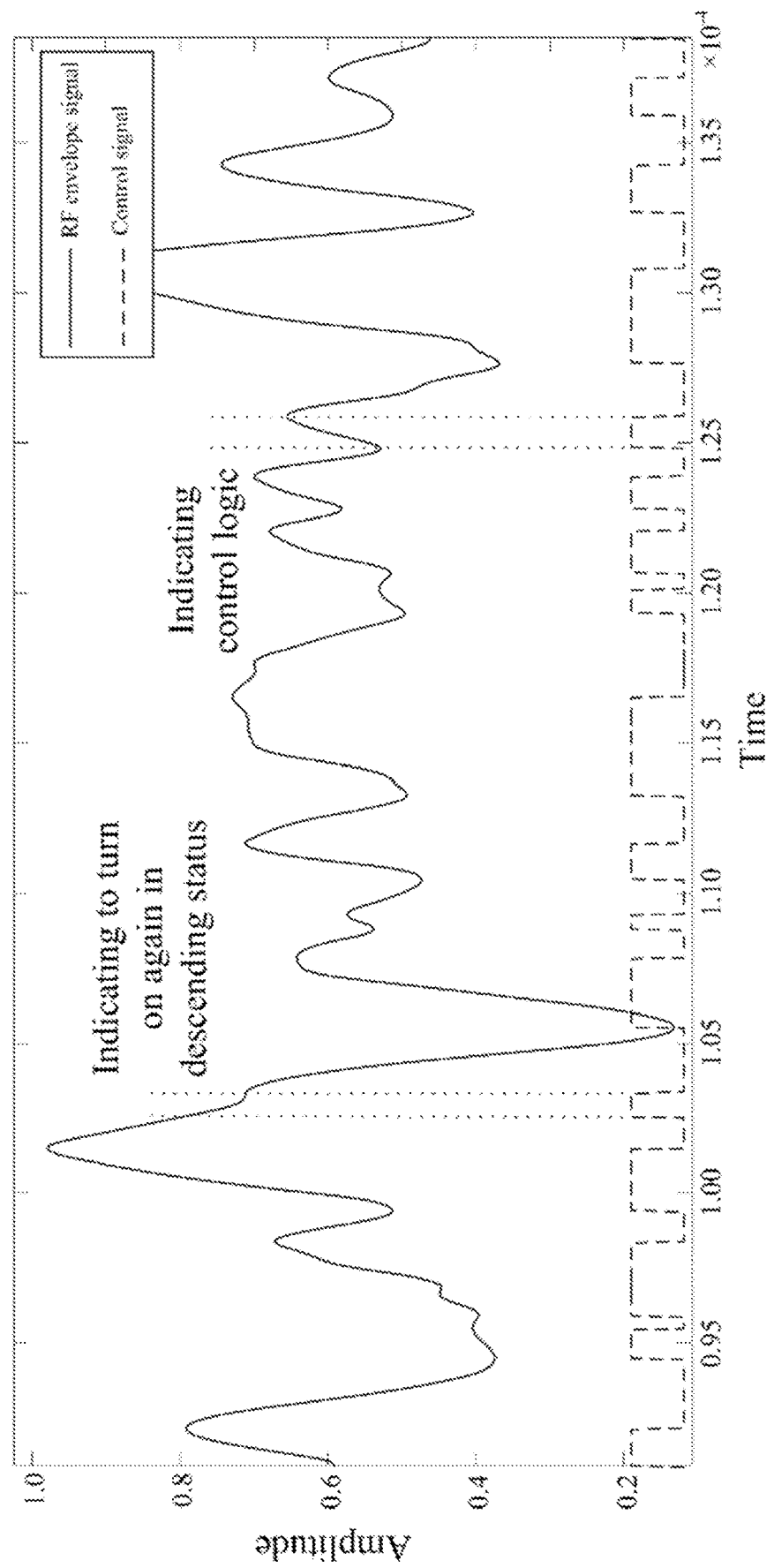
FIG. 6 is a schematic diagram of an optional high-bandwidth switching converter control signal generated based on a key information string including a peak point and a valley point of an envelope, and time points corresponding to the peak point and the valley point according to an embodiment of the present application.

Example 3: FIG. 6 is a schematic diagram of a high-bandwidth switching converter control signal generated based on information distribution features of a peak point and a valley point of an envelope, and time points corresponding to the peak point and the valley point. The generation of the control signal is adapted to the status schematic diagram in FIG. 2. When the previous value of the key information string is less than the latter value, the status determiner may determine that the envelope signal is in an ascending status, the status information is passed to a control signal generating module, and a high-level signal is generated and provided to the high-bandwidth switching converter to turn on a switching transistor. When the previous value of the key information string is greater than the latter value, the status determiner may determine that the envelope signal is in a descending status, the status information is passed to the control signal generating module, and a low-level signal is generated and provided to the high-bandwidth switching converter to turn off the switching transistor. On this basis, a time length between the peak value and the valley value is determined through the key information string. When the time length is greater than a preset threshold T, a high-level signal with a cycle of $t_2$ is given to the high-bandwidth switching converter again after a short time $t_1$, such that the high-bandwidth switching converter is turned on again to provide a current and supplement a difference with the envelope signal. The relationship between $t_1$, $t_2$ and T is $t_1+t_2<T$.

Figure 7:
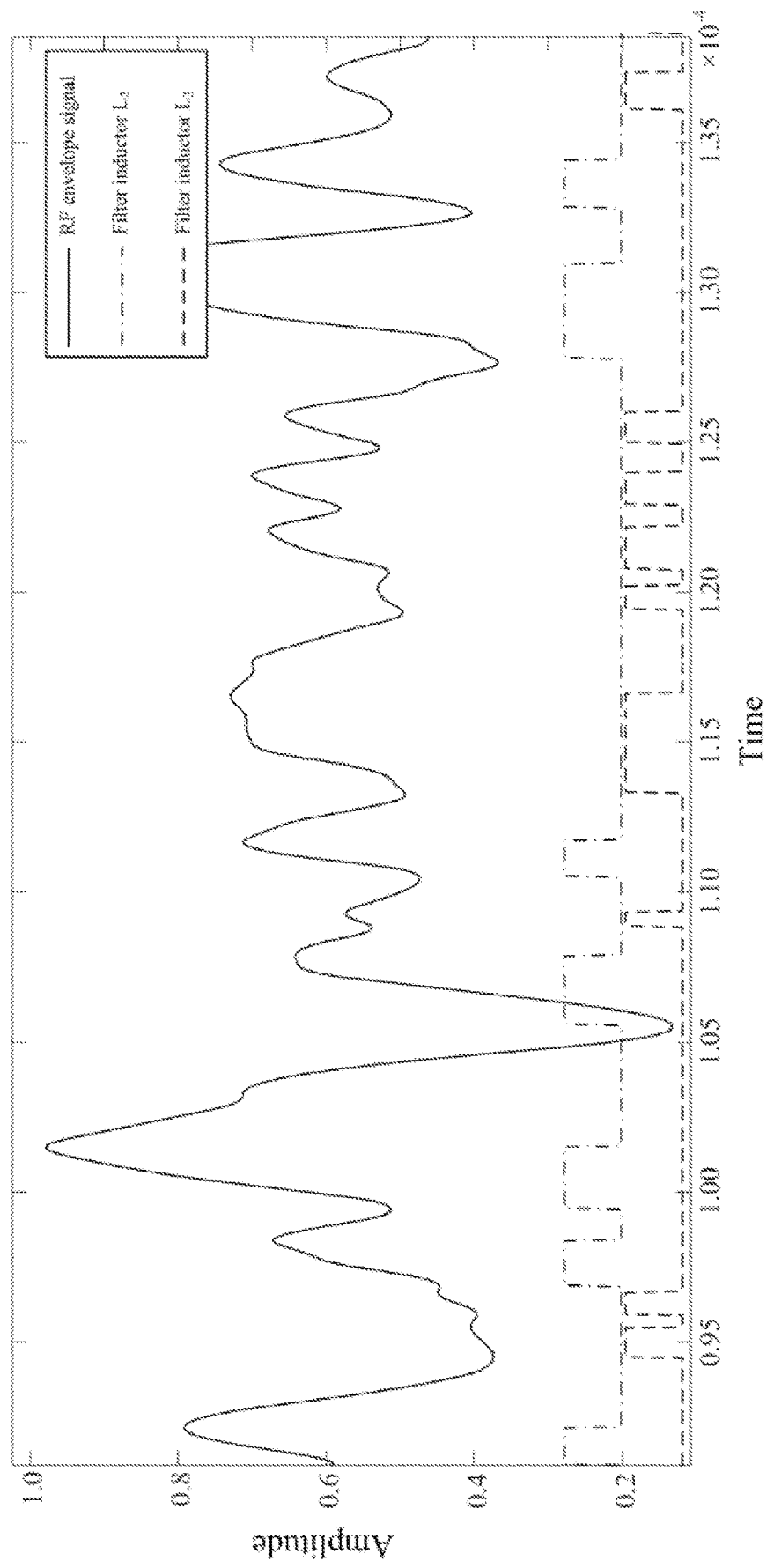
FIG. 7 is an optional filter inductor selecting control signal generated based on a key information string including a peak point and a valley point of an envelope, and time points corresponding to the peak point and the valley point according to an embodiment of the present application.

Example 4: FIG. 7 is a filter inductor control signal generated based on information distribution features of a peak point and a valley point of an envelope, and time points corresponding to the peak point and the valley point. The high-bandwidth switching converter includes two filter inductors $L_2$ and $L_3$. The inductance value of $L_2$ is smaller, and the inductance value of $L_3$ is larger. The slope when the envelope is in the ascending status is calculated through the key information string. When the slope is greater than a preset threshold, the filter inductor $L_2$ with the smaller inductance value is selected to provide a high current change rate; and when the slope is less than the preset threshold, the filter inductor $L_3$ with the larger inductance value is selected to provide a low current change rate.

Compared with the prior art, the technical solution of the present application has the following technical effects: the working principle of the control strategy is simple, and calculation control is performed according to the key information string including the peak point and the valley point of the envelope, and the time points corresponding to the peak point and the valley point, and the calculation workload of hardware is reduced.

Figure 8:
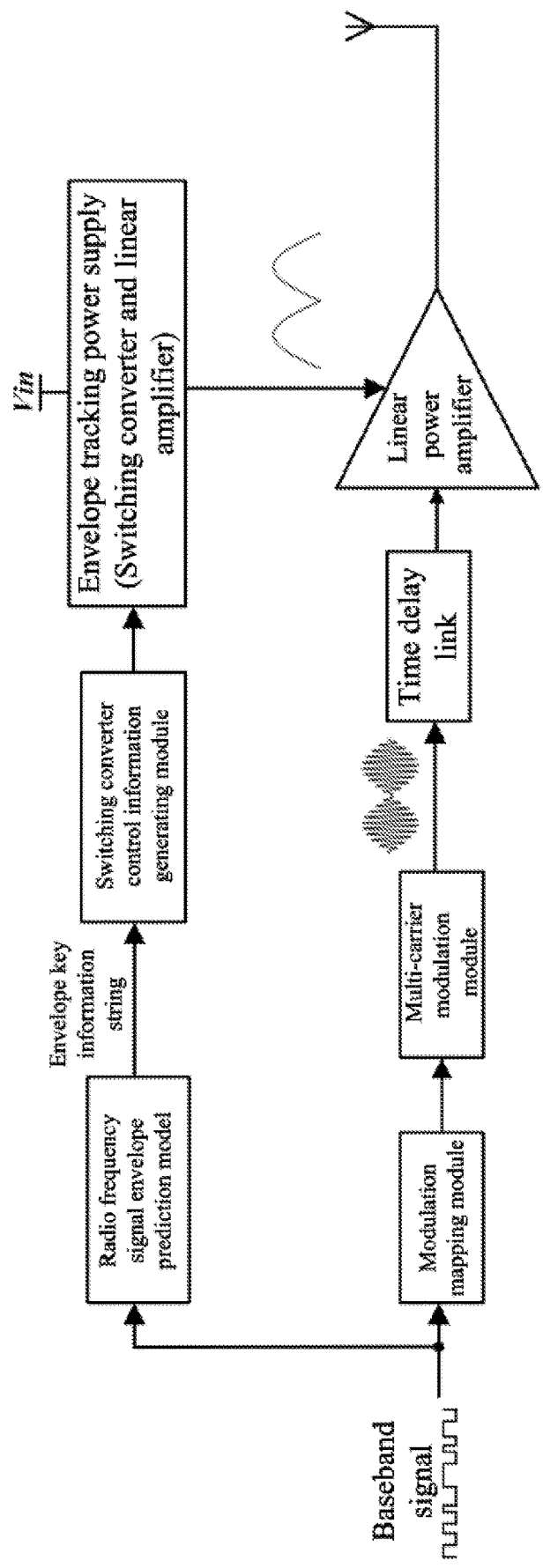
FIG. 8 is a structural schematic diagram of a first optional envelope tracking power supply according to an embodiment of the present application.

The first embodiment is shown in FIG. 8. An envelope tracking power supply structure includes a modulation mapping module, a multi-carrier modulation mapping module, a time delay link, a radio frequency envelope prediction model, a switching converter control information generating module, and an envelope tracking power supply including a combination of switching converters and a linear amplifier. The modulation mapping module is configured to process a baseband signal according to a communication modulation algorithm such as QAM to generate serial data that is input to a multi-carrier modulation module. The multi-carrier modulation module is configured to generate a multi-carrier modulation signal such as OFDM. The function of the time delay link is to match the waveform of a power supply voltage generated by the envelope tracking power supply to synchronize with a radio frequency signal input to the linear amplifier. The function of the radio frequency envelope prediction model is to, based on modulated data of a communication baseband signal as an input, generate an envelope key information string of a radio frequency signal, the envelope key information string including a peak point, a valley point, and time points corresponding to the peak point and the valley point. The switching converter control information generating module is configured to generate a switching signal according to the envelope key information string, which is provided to low-bandwidth and high-bandwidth switching converters in the envelope tracking power supply for use.

Figure 9:
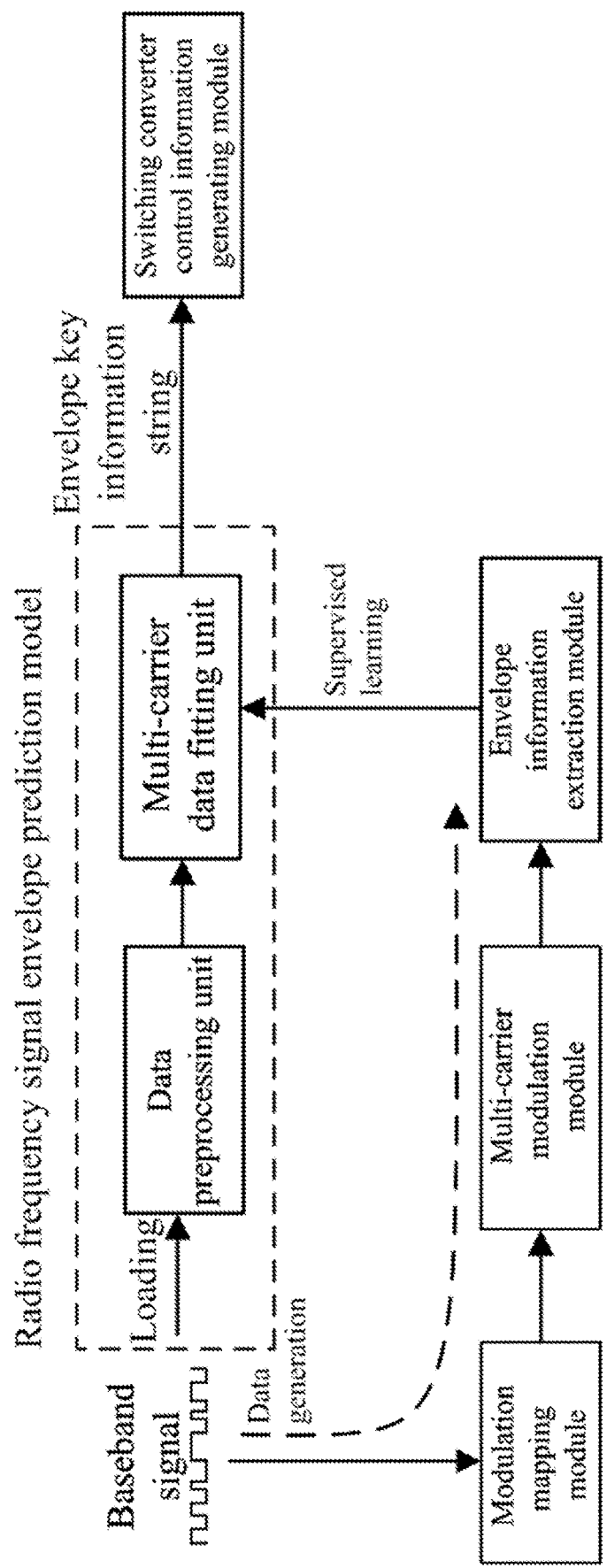
FIG. 9 is a schematic diagram of a construction principle of a first optional radio frequency signal envelope prediction model according to an embodiment of the present application.

FIG. 9 is a structural schematic diagram of a radio frequency signal envelope prediction model according to the first embodiment of the present application. The radio frequency signal envelope prediction model includes a data preprocessing unit and a multi-carrier data fitting unit. The data preprocessing unit is configured to arrange bits in the unit of symbol in a carrier order according to the modulation mapping algorithm used, performs serial-parallel conversion and then inputs them to the multi-carrier data fitting unit. The multi-carrier data fitting unit is a neural network fitting and configured to fit the symbols after serial-parallel conversion with the envelope key information string imported from an envelope information extraction module to finally obtain the peak point and the valley point of the envelope, and the time points corresponding to the peak point and the valley point. In this embodiment, the radio frequency signal envelope prediction model includes the operation processes of three links: the modulation mapping module, the multi-carrier modulation module and the envelope information extraction module. The radio frequency signal envelope prediction model constructed based on neural network is trained by taking a baseband signal as an input and a corresponding envelope key information string as an output to obtain the envelope key information string corresponding to the baseband signal, thereby effectively increasing the speed of generating a switching converter control signal.

The radio frequency signal envelope prediction model is based on presetting each communication baseband sample signal, and passing the baseband signal sample sequentially through the module mapping module, the multi-carrier modulation module and the envelope information extraction module to generate the corresponding envelope information sample. The envelope signal extraction method is made by the following Step A to Step C. Step A: each communication baseband sample signal as an input passes through the modulation mapping module (including modulation mapping mode such as QAM) to obtain serial data corresponding to each communication baseband sample signal, where the baseband sample signal is a series of random 0-bit and 1-bit signals. Step B: the serial data as an input is subjected to multi-carrier modulation transmission to obtain a radio frequency envelope signal, and then proceed to Step C. Step C: the radio frequency envelope signal as an input passes through the envelope information extraction module to obtain an envelope key information string, where the envelope key information string includes information of a peak value and a valley value of the envelope, and time points corresponding to the peak value and the valley value. Next, envelope information is loaded to obtain an information matrix, and a data matrix corresponding to the baseband signal and the envelope key information string is cached as sample data for the neural network to read and learn. Finally, the baseband signal and the envelope information that pass through the data preprocessing unit are input to an artificial neural network, and the multi-carrier fitting unit is trained through Step S11 to Step S13 to obtain a radio frequency signal envelope prediction model, such that the neural network directly predicts and generates radio frequency signal envelope information through the baseband signal.

In Step S12, the data processing includes: equally dividing bits into symbols according to a preset communication modulation algorithm, and performing serial-parallel conversion on the symbols according to the number and the order of carriers.

The method for training the radio frequency signal envelope prediction model can continuously update and optimize the radio frequency signal envelope prediction model. Specifically, the baseband signal sample may be obtained periodically and sequentially passed through the modulation mapping module, the multi-carrier modulation module and the envelope information extraction module to generate a corresponding envelope key information string sample, and meanwhile, the baseband signal sample and the envelope key information string sample are imported into the radio frequency signal envelope prediction model to generate the required envelope key information string; and the envelope prediction model is optimized and updated by comparing the predicted envelope key information string with the envelope key information string sample generated by the envelope information extraction module.

Optionally, the envelope key information string is obtained from the envelope signal by writing a program. For example, a findpeaks function is applied to write a program to obtain an envelope key information string including a peak value and a valley value of an envelope signal, a time point corresponding to the envelope peak value and a time point corresponding to the envelope valley value.

In this embodiment, a corresponding relationship between a baseband signal and information required in an envelope tracking power supply system is trained by using an artificial intelligence algorithm such as a neural network. The trained neural network can rapidly respond to the change of the baseband signal to generate envelope information required in the envelope tracking power supply system. The neural network can be supervised and guided to fit a relationship between a data amount and an output amount of training through supervised learning in machine learning. The multi-carrier data fitting unit of this project is of a neural network structure, and supervised learning can help to adjust the structure of the two networks and the weight of connecting points, thereby continuously improving the prediction accuracy. The source of a supervised learning signal is shown in FIG. 9. After the neural network is trained, the original three links of the modulation mapping module, the multi-carrier modulation module and the envelope information extraction module can be directly replaced with the neural network. A key information string including the peak value, the valley value and the corresponding time points are generated and provided to a circuit in the envelope tracking power supply directly or indirectly. The neural network can continuously obtain envelope information that is generated by passing the baseband signal through the traditional modulation mapping module, multi-carrier modulation module and envelope information extraction module. The neural network trains parameter configuration in a neural network algorithm and optimizes the network structure by learning the result generated by the traditional method, so as to improve the prediction accuracy of the envelope information.

Correspondingly, an embodiment of the present application provides a method for predicting a radio frequency signal envelope based on baseband signal perception. The prediction and generation method includes a radio frequency envelope prediction model constructing module, a baseband signal loading module, a modulation mapping module, a multi-carrier modulation module, an envelope information extraction module and a radio frequency signal envelope prediction model.

Figure 10:
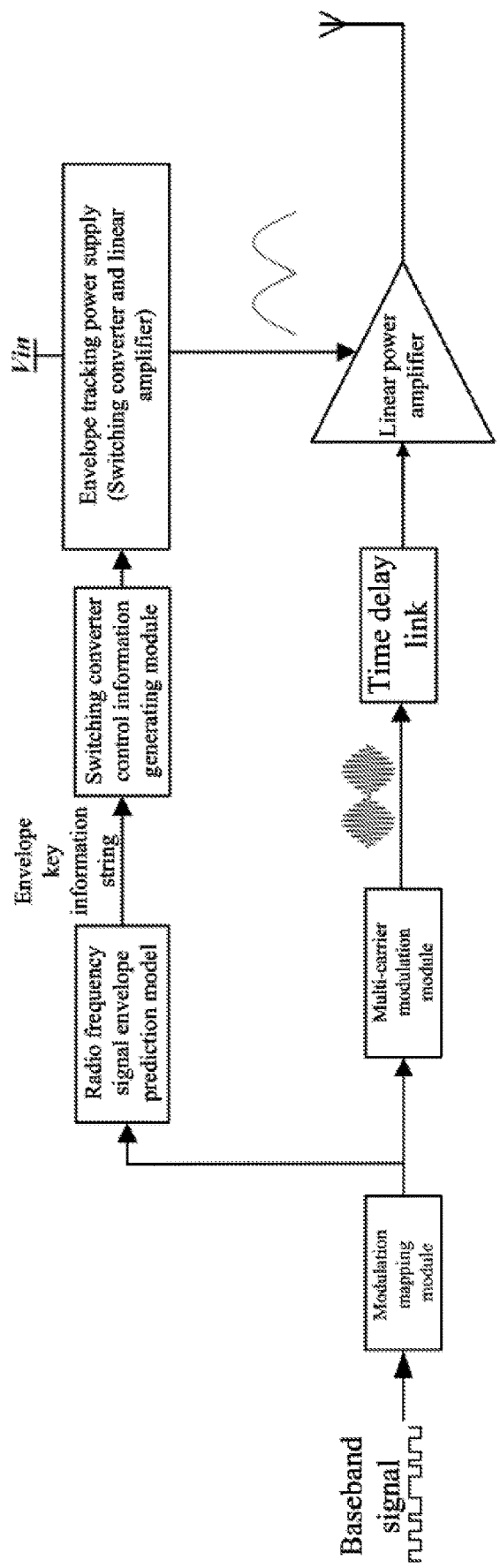
FIG. 10 is a structural schematic diagram of a second optional envelope tracking power supply according to an embodiment of the present application.

FIG. 10 is a second embodiment, where the structure of an envelope tracking power supply is basically the same as that in the first embodiment of FIG. 8. Compared with the first embodiment of FIG. 8, data of the baseband signal after processed by the modulation mapping module is directly processed, and the input data amount of a radio frequency signal envelope prediction network is small, so that data process is simpler, and the occupied hardware resources are fewer.

Figure 11:
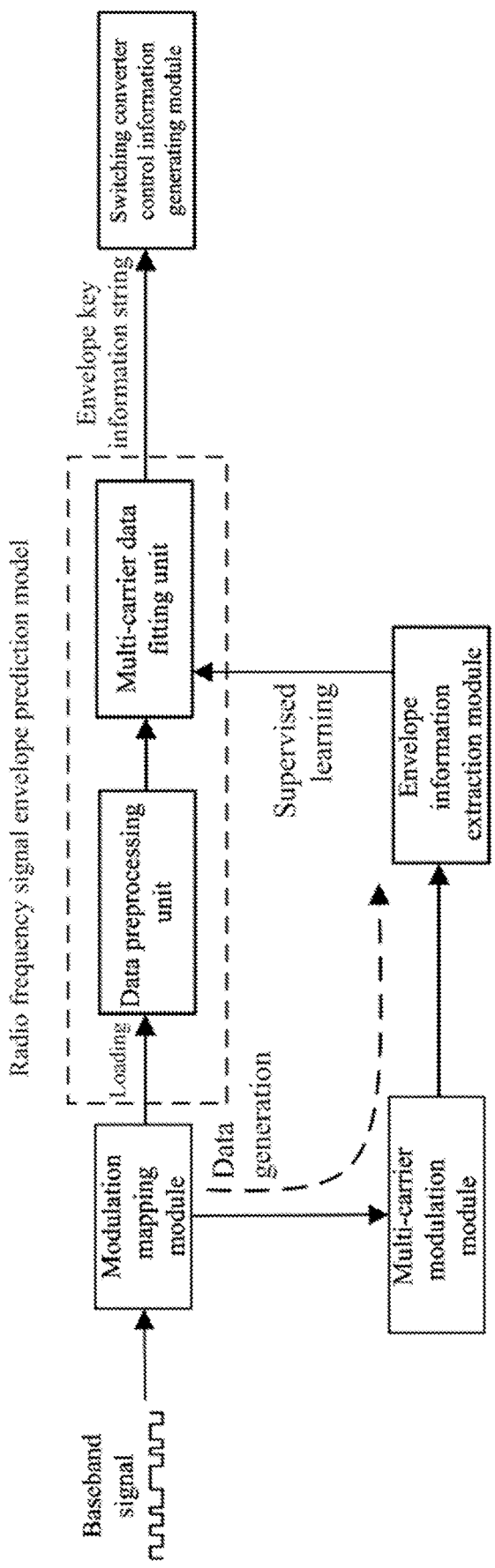
FIG. 11 is a schematic diagram of a construction principle of a second optional radio frequency signal envelope prediction model according to an embodiment of the present application.

FIG. 11 is a structural schematic diagram of a radio frequency signal envelope prediction model according to the second embodiment. Similar to the first embodiment in FIG. 9, the radio frequency signal envelope prediction model includes a data preprocessing unit and a multi-carrier data fitting unit. The difference is that the data preprocessing unit performs splitting of real and imaginary parts on data after modulation mapping according to the modulation mapping algorithm used, performs arrangement in the unit of symbol in a carrier order, and performs parallel input to the multi-carrier data fitting unit. The multi-carrier data fitting unit is used to fit the symbols after serial-parallel conversion with the envelope information imported from the envelope information extraction module to finally obtain the peak point and the valley point of the envelope, and the time points corresponding to the peak point and the valley point. In this embodiment, the radio frequency signal envelope prediction model includes the operation processes of two links: a multi-carrier modulation module and an envelope information extraction module. The radio frequency signal envelope prediction model constructed based on neural network is trained by taking data of a baseband signal after modulation mapping as an input and a corresponding envelope key information string as an output to obtain the envelope key information string corresponding to the baseband signal, thereby effectively increasing the speed of generating a switching converter control signal.

Figure 12:
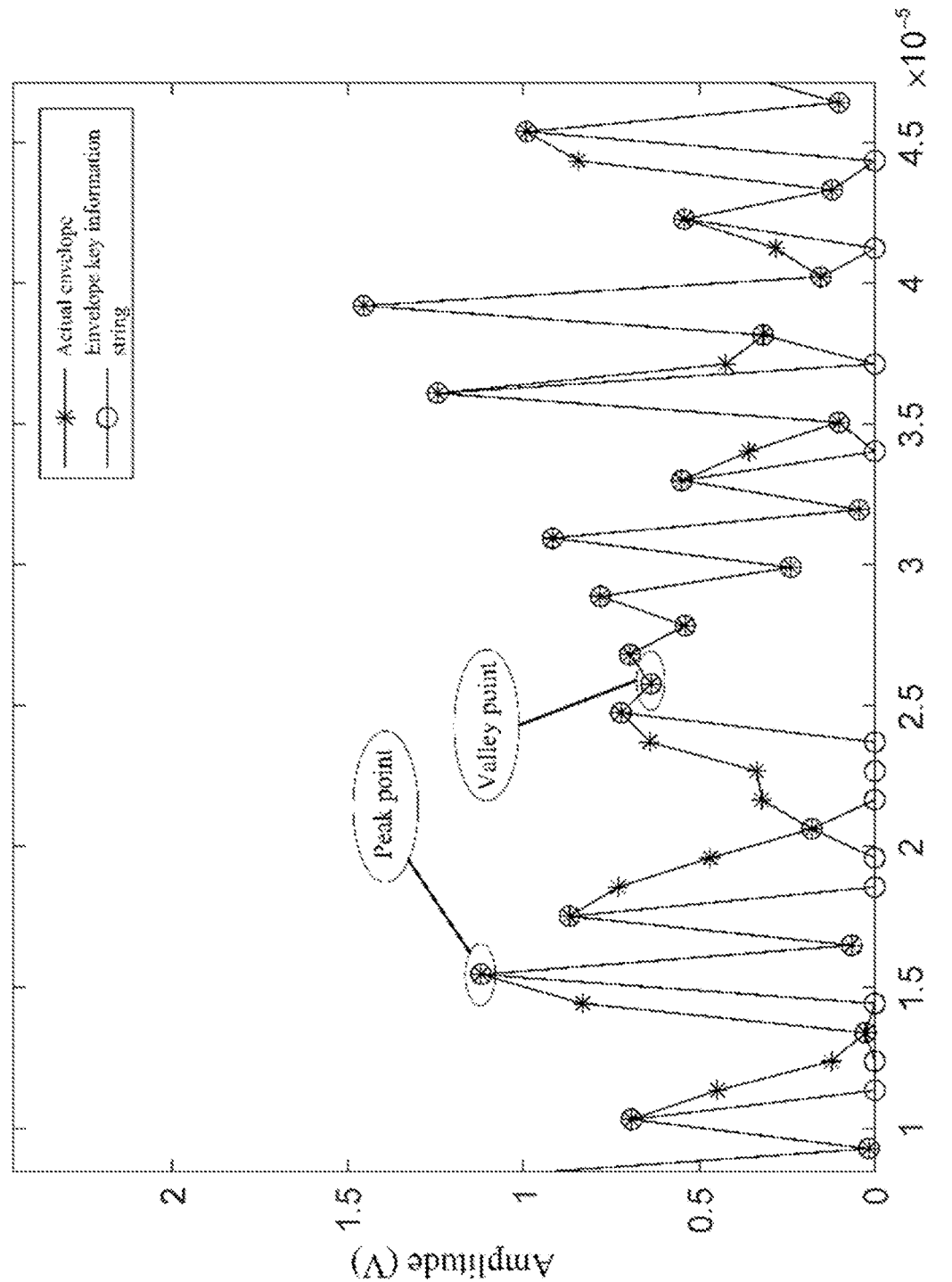
FIG. 12 is a diagram for predicting and generating an envelope key information string based on 64 QAM constellation mapped to 64-subcarrier OFDM modulation.

FIG. 12 is a simulation result diagram of an example of generating an envelope key information string based on 64 QAM constellation mapped to 64-subcarrier OFDM modulation according to the second embodiment. As shown in the figure, it can be seen by comparing a relationship between the envelope key information string and the actual envelope data that a length of the key information string is the same as that of the envelope, values are retained only at the peak point and the valley point, and data is 0 at the positions of non-peak point and non-valley point. It can be seen from FIG. 12 that the solution proposed in the present application has higher accuracy in terms of the peak point and the valley point of the envelope signal, and the time points corresponding to the peak point and the valley point, and takes shorter time than the time consumed by the standard process of generating the RF signal.

The method for predicting the radio frequency signal envelope according to the present application can generate the envelope information required by the envelope tracking power supply directly or indirectly from the baseband signal, so that the system time delay and the required hardware resources are greatly reduced. Compared with the prior art, the above technical solution has the following technical effects: according to the present application, the neural network is used for information perception of the baseband data, and the envelope tracking power supply can obtain the change rule of the envelope signal in advance to generate the switching converter control signal, so that the envelope that changes greatly is tracked more quickly and accurately, and the time delay of the radio frequency signal and the calculation requirement on the hardware are reduced. For other types of ET topologies, such as a digitally controlled series hybrid topology ET power amplifier, the proposed methods in this patent are also applicable.

Optionally, in each exemplary embodiment of the present application, those of ordinary skill in the art can understand that all or part of steps in various methods of the above embodiments may be accomplished by instructing hardware related to a terminal device via a program. The program may be stored in a computer-readable storage medium, and the storage medium may include: a flash disk, a read-only memory (ROM), a random-access memory (RAM), a magnetic disk or an optical disk and the like.

The serial numbers of the above embodiments of the present application are merely for description and do not represent the preferred order of the embodiments.

The integrated unit in the above embodiments, if implemented in the form of a software functional unit and sold or used as an independent product, may be stored in the computer-readable storage medium described above. Based on such an understanding, the technical solution of the present application in essence, or in other words, the part that contributes to the prior art or all or part of the technical solution can be embodied in the form of a software product. The computer software product is stored in the storage medium and includes several instructions that cause one or more computer devices (which may be a personal computer, a server or a network device) to perform all or part of the steps of the method in each embodiment of the present application.

In the above embodiments of the present application, the description of each embodiment has its own emphasis, and for parts not described in detail in a certain embodiment, reference may be made to relevant descriptions of other embodiments.

In several embodiments provided in the present application, it should be understood that the disclosed client side can be implemented in other ways. The device embodiments described above are only illustrative. For example, the division of the units is only a logical function division, and there may be other division methods in actual implementation. For example, a plurality of units or components may be combined or integrated into another system, or some features may be ignored or not implemented. In addition, the mutual coupling or direct coupling or communication connection shown or discussed may be indirect coupling or communication connection through some interfaces, units, or modules, or maybe in electrical or other forms.

The units described as separate components may or may not be physically separate, and the components displayed as units may or may not be physical units, that is, they may be located in one place, or may be distributed over a plurality of network units. Some or all of the units may be selected according to actual needs to achieve the objective of the solutions of the embodiments.

In addition, various functional units in the embodiments of the present application may be integrated into one processing unit, or the units may physically exist separately, or two or more of the units are integrated into one unit. The foregoing integrated unit may be implemented either in the form of hardware or in the form of a software functional unit.

The above description is only preferred embodiments of the present application. It should be noted that those skilled in the art can also make several improvements and modifications without departing from the principle of the present application, and these improvements and modifications should also be considered within the protection scope of the present application.

What is claimed is:

1. A method for predicting envelope features and generating a switching converter control signal in an envelope tracking power supply, comprising:
   according to baseband data or data after modulation mapping, predicting, by a first neural network model, and outputting a peak value of a peak point of a radio frequency envelope signal, a time point corresponding to the peak value, a valley value of a valley point of the radio frequency envelope signal and a time point corresponding to the valley point;
   according to the valley point of the radio frequency envelope signal and the time point corresponding to the valley point, sending, by a reference value generating module, a generated reference value to a pulse width modulation control signal generating module to obtain a low-bandwidth switching converter control switch signal;
   according to adjacent valley point and peak point of the radio frequency envelope signal, and time points corresponding to the adjacent valley point and peak point, sending, by a status determiner, generated status information to a high-bandwidth control signal generating module to obtain a high-bandwidth switching converter control switch signal; and
   when the radio frequency envelope signal is in an ascending status, according to a key information string comprising the peak value, the valley value, and the time points respectively corresponding to the peak value and the valley value, determining a slope k of a connecting line between the valley point and the peak point, sending, by a slope calculator, the calculated slope k to a filter inductor control signal module, and selecting and turning on a corresponding filter inductor in a high-bandwidth switching converter.

2. The method according to claim 1, wherein according to the valley point of the radio frequency envelope signal and the time point corresponding to the valley point, an average of a plurality of valley points within a defined time period or a multiple related to the average or a peak value of the valley points within a preset time is found to serve as a control reference value of a low-bandwidth switching converter; and a duration of the preset time is not less than a response time for establishing an output voltage of the low-bandwidth switching converter, and start and end points of the preset time are composed of the peak value or the valley point.

3. The method according to claim 1, wherein the method for generating the reference value according to the valley point comprises following three types:
  (1) two different peak points of the radio frequency envelope signal serve as start and end points for the reference value, and a first valley weighted average between two different peak values of the two different peak points or a multiple of the first valley weighted average serves as an amplitude of the reference value, obtaining a constant reference value;
  (2) two different valley points of the radio frequency envelope signal serve as start and end points for the reference value, and a second valley weighted average between two different valley values of the two different valley points or a multiple of the second valley weighted average serves as an amplitude of the reference value, obtaining a constant reference value; or
  (3) a specified valley point and a specified peak point of the radio frequency envelope signal serve as start and end points of the reference value, and a third valley weighted average between a valley value of the specified valley point and a valley value of the specified peak point or a multiple of the third valley weighted average as an amplitude of the reference value, obtaining a constant reference value.

4. The method according to claim 1, wherein the sending, by a status determiner, generated status information to a high-bandwidth control signal generating module to obtain a high-bandwidth switching converter control switch signal comprises:
  determining, by the status determiner, whether a current status of the radio frequency envelope signal is an ascending status from a valley value to a peak value or a descending status from a peak value to a valley value; and
  providing a control signal of the high-bandwidth switching converter according to distribution features of the adjacent valley point and peak point, where a high-level signal to turn on a switching transistor is provided at a time of or near the valley value, and a low-level signal to turn off the switching transistor is provided at a time of or near the peak value.

5. The method according to claim 4, wherein when the radio frequency envelope signal is in the ascending status, according to the key information string comprising the peak point and the valley point of the radio frequency envelope signal, and the time points corresponding to the peak point and the valley point, the slope k of the connecting line between the valley point and the peak point is determined, $$k = \frac{V_{peak} - V_{valley}}{t_{peak} - t_{valley}}$$

where in the formula, $V_{peak}$ is an amplitude of the peak value, $V_{valley}$ is an amplitude of the valley value, $t_{peak}$ is a time value of the peak value, and $t_{valley}$ is a time value of the valley value.

6. The method according to claim 5, wherein according to a different slope k, the high-bandwidth switching converter selects a filter inductor with a different inductance value; when the value of the slope k is greater than a preset threshold, the filter inductor with a smaller inductance value is selected to provide a higher current change rate; and when the value of the slope k is less than the preset threshold, the filter inductor with a larger inductance value is selected to provide a lower current change rate.

7. The method according to claim 4, wherein when the radio frequency envelope signal is in the descending status, if a time length between the peak point and the adjacent valley point is greater than a preset threshold T, a high-level signal with a duration $t_2$ is given to the high-bandwidth switching converter again after a time $t_1$, such that the high-bandwidth switching converter is turned on again to provide a current and supplement a difference with the radio frequency envelope signal, where $t_1+t_2<T$.

8. The method according to claim 1, further comprising:
  for a baseband signal or data after modulation mapping, applying a trained radio frequency signal envelope prediction model that takes the baseband signal or the data after modulation mapping as an input and an envelope key information string corresponding to the baseband signal or the data after modulation mapping as an output to obtain the envelope key information string corresponding to the baseband signal or the data after modulation mapping, where the envelope key information string comprises a peak point and a valley point of the radio frequency envelope signal corresponding to the baseband signal or the data after modulation mapping, and time points respectively corresponding to the peak point and the valley point.

9. The method according to claim 8, wherein the radio frequency signal envelope prediction model, based on preset baseband signals, is obtained by a following training method: according to a preset envelope key information string extraction method, obtaining envelope key information strings respectively corresponding to the baseband signals; and training a multi-carrier fitting unit by taking the baseband signal as an input and the envelope key information string corresponding to the baseband signal as an output to obtain the radio frequency signal envelope prediction model.

10. The method according to claim 9, wherein the multi-carrier fitting unit is a neural network structure.

11. The method according to claim 9, wherein the preset envelope key information string extraction method comprises following steps:
  Step A: subjecting each baseband signal as an input to modulation to obtain serial data corresponding to each baseband signal, and then entering Step B, where a baseband sample signal is a series of random 0-bit and 1-bit signals;
  Step B: subjecting the serial data as an input to multi-carrier modulation to obtain a radio frequency envelope signal, and then entering Step C; and
  Step C: passing the radio frequency envelope signal as an input through an envelope key information string extraction module to obtain the envelope key information string.

12. The method according to claim 9, wherein the training a multi-carrier fitting unit by taking a 0-bit or 1-bit baseband signal as an input and the envelope key information string corresponding to the baseband signal as an output to obtain the radio frequency signal envelope prediction model comprises:
  Step S11: loading the baseband signal to the multi-carrier fitting unit to serve as an input signal, and then entering Step S12;

Step S12: subjecting the baseband signal as an input to data grouping and serial-parallel processing to obtain serial-parallel symbols, and then entering Step S13; and Step S13: subjecting the serial-parallel symbols as an input to multi-carrier data fitting to obtain the envelope key information string.

13. The method according to claim 12, wherein in Step S12, the data grouping and serial-parallel processing comprises: equally dividing bits into symbols according to a preset communication modulation algorithm, and performing serial-parallel processing on the symbols according to the number of carriers to obtain serial-parallel symbols.

14. The method according to claim 9, wherein the envelope key information string comprises a peak point and a valley point of an radio frequency envelope signal, and time points respectively corresponding to the peak point and the valley point.

15. The method according to claim 9, wherein process of constructing the radio frequency signal envelope prediction model further comprises: performing the training method periodically to continuously update and optimize the radio frequency signal envelope prediction model.

16. The method according to claim 8, wherein the envelope key information string is obtained from the radio frequency envelope signal by writing a program.

17. The method according to claim 8, wherein the radio frequency signal envelope prediction model, based on preset data after modulation mapping, is obtained by a following training method: according to a preset envelope key information string extraction method, obtaining envelope key information strings respectively corresponding to data sample signals after modulation mapping; and training a multi-carrier fitting unit by taking the data sample signal after modulation mapping as an input and the envelope key information string corresponding to the data sample signal after modulation mapping as an output to obtain the radio frequency signal envelope prediction model.

18. The method according to claim 17, wherein the multi-carrier fitting unit is a neural network structure.

19. The method according to claim 17, wherein the preset envelope key information string extraction method comprises following steps:

Step A1: subjecting each baseband signal as an input to modulation mapping to obtain corresponding serial data after modulation mapping, and then entering Step B1, where a baseband sample signal is a series of random 0-bit and 1-bit signals;

Step B1: subjecting the serial data as an input to multi-carrier modulation to obtain a radio frequency envelope signal, and then entering Step C1; and Step C1: passing the radio frequency envelope signal as an input through an envelope key information string extraction module to obtain the envelope key information string.

20. The method according to claim 17, wherein the training a multi-carrier fitting unit by taking data after modulation mapping as an input and the envelope key information string corresponding to the data as an output to obtain the radio frequency signal envelope prediction model comprises:

Step S21: loading data after modulation mapping to the multi-carrier fitting unit to serve as an input signal, and then entering Step S22;

Step S22: subjecting the data after modulation mapping as an input to data grouping, real-part and imaginary-part splitting and serial-parallel processing to obtain serial-parallel symbols, and then entering Step S23; and Step S23: subjecting the serial-parallel symbols as an input to multi-carrier data fitting to obtain the envelope key information string.

21. The method according to claim 20, wherein in Step S22, the data grouping, real-part and imaginary-part splitting and serial-parallel processing comprises: performing splitting of real and imaginary parts on data after modulation mapping according to a preset multi-carrier modulation algorithm, performing arrangement in a carrier order, and performing serial-parallel processing jointly to obtain the serial-parallel symbols.

22. The method according to claim 17, wherein the envelope key information string comprises a peak point and a valley point of an radio frequency envelope signal, and time points respectively corresponding to the peak point and the valley point.

23. A non-transitory computer-readable storage medium, which stores a computer program configured to, when running, perform steps of the method according to claim 1.

24. An electronic device, comprising a memory and a processor, where the memory stores a computer program, and the processor is configured to run the computer program to perform steps of the method according to claim 1.

* * * * *